(12) United States Patent
Danvir et al.

(10) Patent No.: US 7,265,994 B2
(45) Date of Patent: Sep. 4, 2007

(54) UNDERFILL FILM FOR PRINTED WIRING ASSEMBLIES

(75) Inventors: Janice Danvir, Arlington Heights, IL (US); Katherine Devanie, Arlington Heights, IL (US); Nadia Yala, Schaumburg, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 413 days.

(21) Appl. No.: 10/356,419

(22) Filed: Jan. 31, 2003

(65) Prior Publication Data

US 2004/0150967 A1 Aug. 5, 2004

(51) Int. Cl.
*H05K 7/10* (2006.01)
*H05K 7/12* (2006.01)

(52) U.S. Cl. .............. 361/767; 361/768; 361/771; 174/260

(58) Field of Classification Search ............ 361/767, 361/768, 771; 257/686, 778, 787; 174/260; 438/108, 109, 126; 29/841
See application file for complete search history.

(56) References Cited

U.S. PATENT DOCUMENTS

| | | | | |
|---|---|---|---|---|
| 5,784,261 A * | 7/1998 | Pedder | ..................... | 361/767 |
| 5,796,169 A * | 8/1998 | Dockerty et al. | ........... | 257/780 |
| 5,834,848 A * | 11/1998 | Iwasaki | ..................... | 257/778 |
| 5,836,715 A * | 11/1998 | Hendrix et al. | .............. | 404/134 |
| 5,918,113 A * | 6/1999 | Higashi et al. | .............. | 438/119 |
| 5,920,125 A * | 7/1999 | Ellerson et al. | ............. | 257/778 |
| 5,994,168 A * | 11/1999 | Egawa | ..................... | 438/118 |
| 6,139,705 A * | 10/2000 | Brown et al. | ............... | 204/284 |
| 6,204,163 B1 * | 3/2001 | Panchou et al. | ........... | 438/613 |
| 6,291,899 B1 * | 9/2001 | Wensel et al. | .............. | 257/787 |
| 6,333,206 B1 * | 12/2001 | Ito et al. | ..................... | 438/106 |
| 6,426,566 B1 * | 7/2002 | Sawamoto | .................. | 257/783 |
| 6,570,259 B2 * | 5/2003 | Alcoe et al. | ................. | 257/778 |
| 6,657,313 B1 * | 12/2003 | Brofman et al. | ............ | 257/781 |
| 6,815,830 B2 * | 11/2004 | Miyasaka | .................... | 257/778 |
| 6,855,574 B2 * | 2/2005 | Thurgood | .................... | 438/106 |
| 6,877,964 B2 * | 4/2005 | Burns et al. | ............. | 417/410.1 |
| 2002/0162679 A1 * | 11/2002 | Hannan et al. | ............. | 174/52.4 |
| 2005/0139389 A1 * | 6/2005 | Yamamoto et al. | ......... | 174/260 |

* cited by examiner

*Primary Examiner*—Tuan T. Dinh

(57) ABSTRACT

A self supported underfill film (18) adhesively bonds surface mount integrated circuit packages (14) to a printed circuit board (10). The printed circuit board has conductive traces (12) and exposed conductive pads (13) on the surface. A film adhesive is strategically positioned on the printed circuit board near the conductive pads, and the surface mount integrated circuit package is then placed on the board so that the conductive pads (16) on the package align with the conductive pads on the board. The film adhesive softens when the package is soldered to the board, and the film ultimately serves as an underfill to increase the mechanical integrity of the solder joints.

14 Claims, 2 Drawing Sheets

UNDERFILL FILM FOR PRINTED WIRING ASSEMBLIES

This invention was made with United States Government support under Agreement No. 70NANB8H4007 awarded by the National Institute of Standards and Technology (NIST). The United States Government has certain rights in the invention.

The U.S. Government has a paid-up license in this invention and the right in limited circumstances to require the patent owner to license others on reasonable terms as provided for by the terms of Grant No. 70NANB8H4007 awarded by NIST.

FIELD OF THE INVENTION

This invention relates generally to printed wiring assemblies. More particularly, this invention relates to the use of underfill adhesives to bond surface mount integrated circuit packages to printed circuit boards.

BACKGROUND OF THE INVENTION

Integrated circuit (IC) packages such as Flip Chip (FC) and Ball Grid Array (BGA) packages are directly attached to printed circuit boards (PCB) by means of surface mount solder joints. This technology is widely used today in electronic items from computers to cellular telephones to produce very efficient, high-density products.

However, when these packages are mounted on printed circuit boards, mechanical stresses transmitted to the solder joints can cause the interconnect system to fail by any number of mechanisms, such as cracking of the solder joint or circuit trace, or a solder pad may delaminate from the PCB. These mechanical stresses can arise from a number of sources, such as thermal mismatch between the package and the PCB, but most commonly are caused by mechanical shock when the electronic product is dropped. One common solution to this problem has been known for some time. Specifically, a liquid polymerizable material, called an "underfill", is flowed under the package after it is soldered to the PCB. Once the underfill has completely filled the small gap that exists between the bottom of the flip chip and the substrate, the material is hardened by polymerization. The hardened, polymerized underfill locks the IC package and the PCB together so that there is little if any differential movement. By controlling excessive stresses that would otherwise form in the joints between the chip and PCB, a reliable assembly can be fabricated.

While the conventional use of underfill has solved the mechanical shock problem on PCBs, it has given rise to a series of significant manufacturing problems. First, the pre-polymerized liquid underfill must be applied as a secondary process with special equipment. Typically, the underfill is applied to one, two or three edges of the assembled package and allowed to flow all the way under the mounted package. Once the material has flowed to opposite edges and all air has been displaced from under the chip, additional underfill may be dispensed to those outer edges to form a fillet. The fillet increases reliability and is generally preferred even though it requires additional manufacturing time. Next the assembly is baked in an oven to polymerize and harden the underfill, again adding time to the process. This baking process normally takes 10 to 30 minutes, although it can take several hours, and the added equipment and its maintenance adds significantly to manufacturing costs. Thus, while the use of underfill helps to alleviate the mechanical shock problem and provides a commercial solution, the electronic device manufacturing industry seeks more efficient manufacturing methods with lower associated costs.

Recently, advances have been made which improve and streamline the underfill process. One method involves dispensing underfill onto the IC package prior to assembling to the board. An underfill that is pre-dispensed before soldering should contain flux or have properties that facilitate solder joint formation. Since the pads on circuit often oxidize and since tin/lead solder bumps on IC packages are usually oxidized, the flux and underfill must be designed to reduce these oxide coatings and facilitate solder joint formation. While simplifying the IC package assembly process, this method still requires extra steps. In spite of the numerous advantages provided by IC package underfill technology, a simpler method of applying underfill is needed. A need also exists for process methodologies which reduce the number of process steps required with underfill application.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention. In the description below, like reference numerals are used to describe the same, similar or corresponding elements in the several views of the drawings in which:

DETAILED DESCRIPTION OF THE INVENTION

Figure 1:
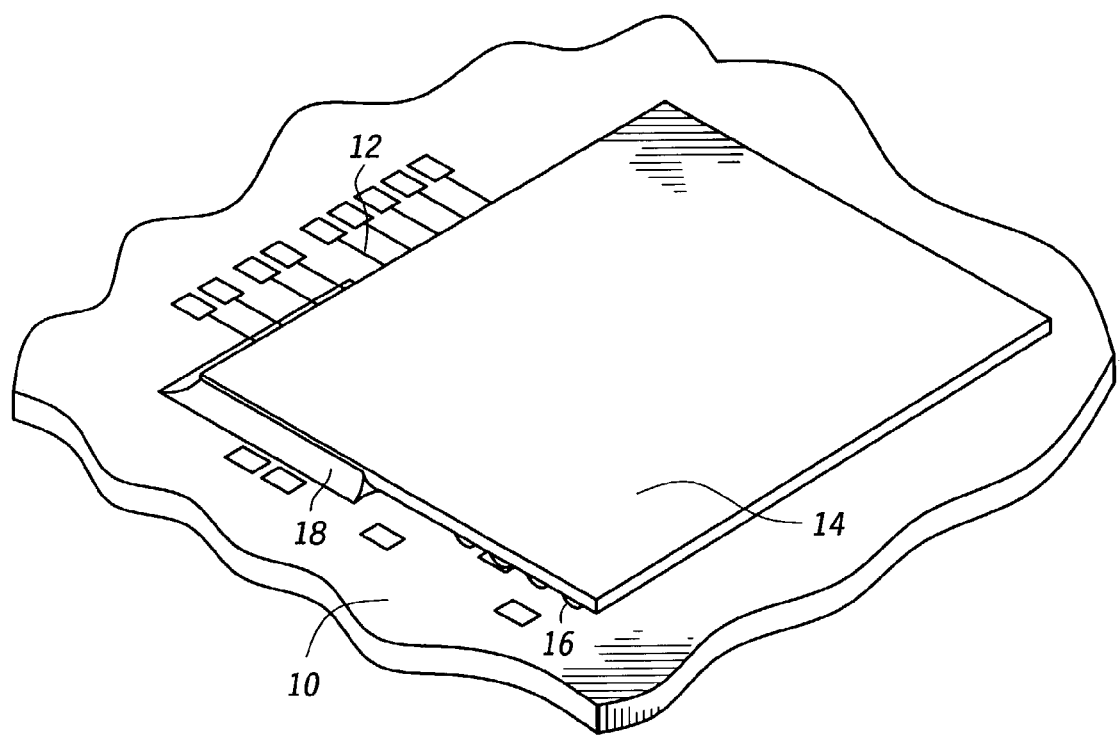
FIG. 1 is an isometric view of a ball grid array package mounted on a printed circuit board in accordance with the present invention.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding elements in the several views of the drawings.

A self supported underfill film adhesively bonds surface mount integrated circuit packages to a printed circuit board. The printed circuit board has conductive traces and exposed conductive pads on the surface. A film adhesive is strategically positioned on the printed circuit board near the conductive pads, and the bumped surface mount integrated circuit package is then placed on the board so that the conductive pads on the package align with the conductive pads on the board. The film adhesive softens when the package is soldered to the board, and the film ultimately serves as an underfill to increase the mechanical integrity of the solder joints.

Figure 2:
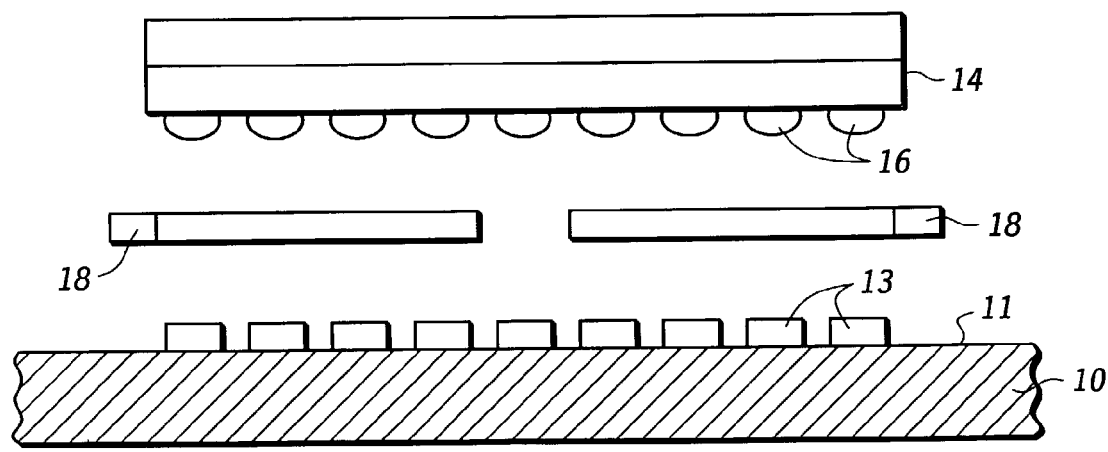
FIG. 2 is an exploded side view of a ball grid array package mounted on a printed circuit board in accordance with the present invention.
Figure 5:
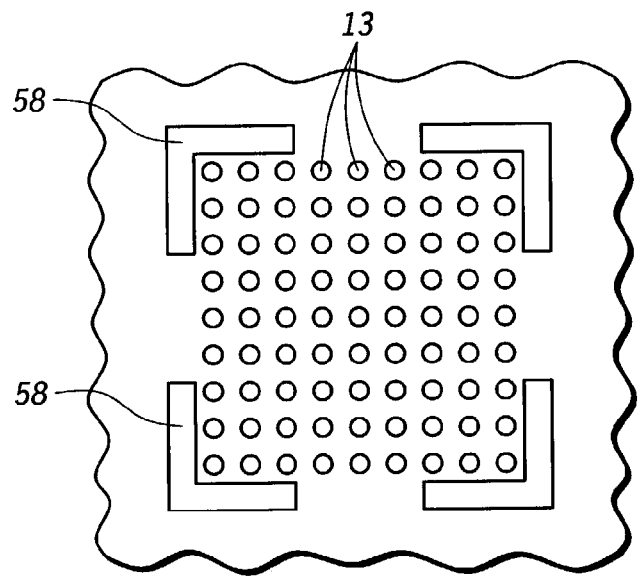
FIG. 5 is a partial plan view of a printed circuit board with underfill film attached thereto to depict the positioning of the film in accordance with an embodiment of the present invention.

Referring now to FIGS. 1 and 2, a printed circuit board 10 designed for surface mount components has conductive traces 12 on at least one major surface or side 11, in conventional manner. The PCB 10 also has a plurality of conductive pads 13 disposed on that side and connected to at least some of the conductive traces 12, typically arranged in a pattern, such as an array, and situated to receive an integrated circuit package 14. The conductive pads 13 are typically exposed so as to enable electrical connection between the IC package 14 and the traces 12 on the PCB. The IC package, such as a ball grid array, a flip chip package, or other type of area array surface mount package, typically has an array of contacts or terminals 16 on the underside of the package, that are connected to the integrated circuit in conventional fashion as is well known to those of ordinary skill in the art. These contacts 16 are typically bumped with a solder ball to enable the IC package to be reflow soldered to the corresponding conductive pads 13 on the PCB. A self supporting film adhesive 18 is placed on the PCB near, but not touching, the conductive pads 13. The adhesive film 18 functions as the underfill between the IC package 14 and the PCB 10 and serves to rigidize the assembly after the package is soldered to the PCB. Referring now to FIG. 5, in one embodiment the adhesive film 58 is cut in a shape of the letter "L" and strategically placed at each of the four corners of the array of conductive pads. The adhesive film is carefully positioned so that it is close to the individual conductive pads, but not touching the pads, so as to not interfere with soldering of the IC package to the PCB. Unlike the prior art that dispenses underfill after attachment to the PCB, and unlike prior art that pre-dispenses underfill on the IC package, our invention utilizes a self supporting film of adhesive that is placed onto the PCB prior to the time that the IC package is placed on the PCB. Because the underfill adhesive is in the form of a self supporting film, it can be pre-packaged in, for example, tape and reel format so as to be easily manipulated by placement machines or robots just like any other electronic component. In practice, the film is placed onto the PCB by one or more placement machines just prior to placing the IC package, and remains in place until the IC package is deposited onto its location. When the IC package is placed on the PCB, the film and package remain in place. During the solder reflow step, the solder bumps on the IC package melt and are soldered to the PCB conductive pads 13 and simultaneously the underfill adhesive film 18 softens and flows to form a fillet around the outside edge of the IC package as is shown in FIG. 1. The degree of softening and flow depends, of course, on the characteristics of the adhesive selected for the underfill film. For example, a thermoplastic adhesive will soften and flow during the soldering step, and then harden upon cooling to room temperature. Thermoset adhesives, such as epoxies, polyesters, polyurethanes, and polyimides will experience little or no softening, and generally flow less than thermoplastics, but still create a small fillet prior to curing to a rigid solid. In either case, upon cooling, the adhesives harden to lock the IC package securely in place and prevent differential movement during subsequent mechanical shocks that may occur in the life cycle of the electronic product.

Figure 3:
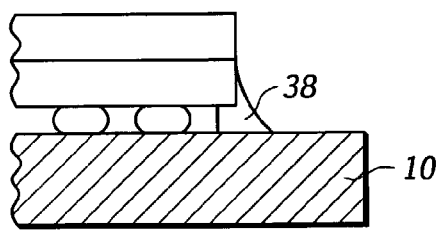
FIGS. 3 and 4 are partial side views of a ball grid array package mounted on a printed circuit board in accordance with various embodiments of the present invention.
Figure 4:
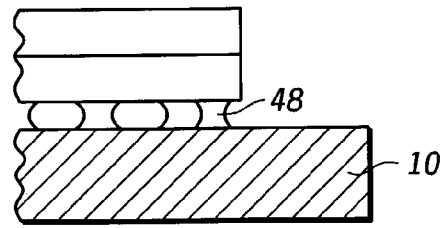
Figure 6:
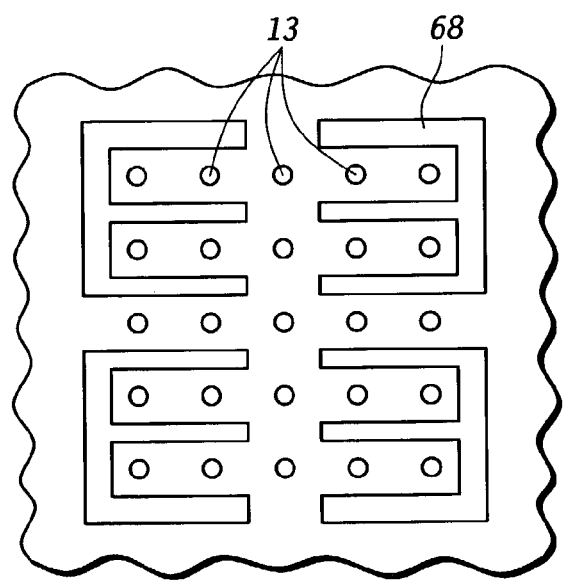
FIG. 6 is a partial plan view of a printed circuit board with underfill film attached thereto to depict the positioning of the film in accordance with another embodiment of the present invention.

Referring now to FIG. 3, an underfill film adhesive that flows will form a fillet 38 similar to that shown, with a portion of the fillet contacting the underside of the IC package and a portion extending up the outside rim of the package to form a meniscus. In this preferred embodiment, the underfill extends beyond the package edge, and we find that this provides superior resistance to mechanical shock. FIG. 4 shows an underfill film adhesive 48 that is completely under the IC package, forming a concave fillet. In practice, we have found that this configuration provides improved shock resistance, but not to the degree that is found in the case of the preferred fillet outside the package edge. As discussed above and depicted in FIG. 5, the preferred shape of the adhesive film 58 is an "L" shape, one "L" shaped film on each corner of the array, that captures the corners of the IC package but does not touch the individual solder pads 13 on the PCB. The space between the "L" shaped films provides openings in the middle along each side of the package perimeter to permit volatile gases generated in the soldering operation to escape from underneath the package. These openings also provide for faster soldering by increasing convective heat under the IC package. An alternate embodiment of our invention is shown in FIG. 6 where the self supporting underfill adhesive film 68 is in the form of a mesh or grid pattern, surrounding individual solder pads 13 or groups of pads on the PCB array.

The self supporting adhesive underfill film 18 can be pure polymer, or it can be filled with a filler to alter the physical properties of the adhesive. For example, numerous inorganic fillers such as silica, titanium dioxide, carbon fibers, microballoons, etc. are well known to those skilled in the art and can be easily added to the film, along with organic dyes. This is advantageous because it reduces the inherent flexibility of the film, making it easier to handle in an automated factory. Laminated films can also be used, with a stiffener laminated longitudinally as, for example, the center core between two layers of adhesive film. Stiffeners such as metal foils, glass fiber mats, paper sheets, or a layer of fully cured thermoset polymer, etc. can be laminated to the adhesive film.

In summary, and without intending to limit the scope of the invention, a novel method of providing an underfill for surface mounted IC packages on printed circuit boards utilizes a self supporting film of adhesive placed on the PCB prior to placing the IC package. The film is then cured or softened during the solder reflow step to bond the IC package to the PCB, preventing stresses from mechanical shock to be concentrated at the solder joints. Those skilled in the art will recognize that the present invention has been described in terms of exemplary embodiments based upon use of a solder bumped ball grid array on a glass reinforced printed circuit board. However, the invention should not be so limited, since other variations will occur to those skilled in the art upon consideration of the teachings herein. For example, while the invention is primarily directed at the use of solder bumped and reflowed IC packages, one can also employ the invention with other non-solder types of attachment methodologies, such as conductive inks, conductive elastomers, gold plated pads, etc., and these types of systems are contemplated in the attached claims. Alternatively, one can employ a pressure sensitive adhesive that does not soften or flow, but simply locks the IC package in place upon contact, or use an adhesive that softens or cures via electromagnetic radiation.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A printed wiring assembly, comprising:
   a printed circuit board, having a plurality of conductive traces on a major surface thereof;
   a surface mount integrated circuit package having an array of conductive pads on a major surface thereof, said package mounted on said printed circuit board such that at least a portion of the array of conductive pads contact a corresponding portion of the conductive traces;
   an underfill adhesive disposed between said package and said printed circuit board, such that the underfill adhesively bonds said package to said printed circuit board; and wherein said underfill adhesive does not extend completely around the package perimeter, and said underfill adhesive is applied as an open mesh grid free film.

2. The printed wiring assembly as described in claim 1, wherein the underfill adhesive is softened by electromagnetic energy.

3. The printed wiring assembly as described in claim 1, wherein a portion of the underfill adhesive extends beyond the package edge.

4. The printed wiring assembly as described in claim 1, wherein the underfill adhesive does not contact the array of conductive pads.

5. The printed wiring assembly as described in claim 1, wherein the underfill adhesive contains one or more additives selected from the group consisting of an inorganic filler, a dye, a pigment, and a stiffening layer.

6. The printed wiring assembly as described in claim 1, wherein the underfill adhesive is a thermoset adhesive.

7. The printed wiring assembly as described in claim 1, wherein the underfill adhesive is a thermoplastic adhesive.

8. The printed wiring assembly as described in claim 1, wherein the open mesh grid free film comprises a film form having at least a first portion and two or more additional portions perpendicular to and coupled to the first portion.

9. A printed wiring assembly, comprising:
   a printed circuit board, having a plurality of conductive traces on a major surface thereof;
   a surface mount integrated circuit package having an array of conductive pads on a major surface thereof, said package mounted on said printed circuit board such that at least a portion of the array of conductive pads contact a corresponding portion of the conductive traces;
   an underfill adhesive disposed between said package and said printed circuit board along at least a portion of a perimeter of said package major surface, to adhesively bond said package to said printed circuit board; and
   wherein said underfill adhesive is applied as an open mesh grid free film, and whereas after application said underfill adhesive is softened to flow and bond said package to said printed circuit board;
   wherein the underfill adhesive does not extend completely around the package perimeter.

10. The printed wiring assembly as described in claim 9, wherein a portion of the underfill adhesive extends beyond the package edge.

11. The printed wiring assembly as described in claim 9, wherein the underfill adhesive contains one or more additives selected from the group consisting of an inorganic filler, a dye, a pigment, and a stiffening layer.

12. The printed wiring assembly as described in claim 9, wherein the underfill adhesive is a thermoset adhesive.

13. The printed wiring assembly as described in claim 9, wherein the underfill adhesive is a thermoplastic adhesive.

14. A printed wiring assembly, comprising:
   a printed circuit board, having a plurality of conductive traces on a major surface thereof;
   a surface mount integrated circuit package having an array of conductive pads on a major surface thereof, said package mounted on said printed circuit board such that at least some of the conductive pads are soldered to at least some of the conductive traces; and
   an open mesh grid free film underfill adhesive for bonding said package to said printed circuit board, wherein the underfill adhesive does not extend completely around the package perimeter.

* * * * *